United States Patent
Congdon

(10) Patent No.: US 6,639,777 B1
(45) Date of Patent: Oct. 28, 2003

(54) ELECTRONIC TIMER SWITCH

(76) Inventor: James S. Congdon, P.O. Box 617, Sudbury, MA (US) 01776

( * ) Notice: Subject to any disclaimer, the term of this patent is extended or adjusted under 35 U.S.C. 154(b) by 119 days.

(21) Appl. No.: 10/012,184

(22) Filed: Oct. 30, 2001

Related U.S. Application Data

(60) Provisional application No. 60/244,545, filed on Oct. 31, 2000.

(51) Int. Cl.[7] .................................................. H02H 3/00
(52) U.S. Cl. ........................................................ 361/94
(58) Field of Search .............................. 361/18, 19, 90, 361/94, 98, 100

(56) References Cited

U.S. PATENT DOCUMENTS

| | | | |
|---|---|---|---|
| 4,933,798 A | * | 6/1990 | Widmayer et al. |
| 5,134,323 A | | 7/1992 | Congdon |
| 5,502,610 A | * | 3/1996 | Chaney |
| 5,719,732 A | * | 2/1998 | Nagahama et al. |

OTHER PUBLICATIONS

Application Note by BitParts, Inc. entitled, QBAR Solid–State, Normally–Closed Switches, 4 pages, no date.
Application Note by Philips Semiconductors entitled, AN170 NE555 and NE556 Applications, 19 pages, no date.
Data Sheet by BitParts, Inc. entitled, QB104M3 QBAR Normally–Closed Switch, 2 pages, no date.
Data Sheet by BitParts, Inc. entitled, QB312–A QBAR Normally–Closed Switch, 2 pages, no date.
Manual by Array Design Inc. entitled. 700 Series Linear Bipolar Semicustom Chips, 5 pages, no date.

* cited by examiner

*Primary Examiner*—Edward H. Tso
(74) *Attorney, Agent, or Firm*—Kriegsman & Kriegsman

(57) ABSTRACT

A timer switch for suspending the application of a direct current input voltage to a load upon the detection of a voltage irregularity in the input voltage. The timer switch includes a transistor switch for selectively connecting the input voltage to the load. The timer switch also includes a timing element which detects the presence of a voltage irregularity in the input voltage and controls the state of the transistor switch based upon the detection of a voltage irregularity in the input voltage. The timer switch includes exactly three terminals and is powered by the input voltage. The timing element includes exactly one energy storage element which is represented as a capacitor.

26 Claims, 7 Drawing Sheets

ELECTRONIC TIMER SWITCH

CROSS-REFERENCE TO RELATED APPLICATIONS

The present application claims the benefit of U.S. Provisional Patent Application Serial No. 60/244,545, which was filed on Oct. 31, 2000 in the name of James S. Congdon.

BACKGROUND OF THE INVENTION

The present invention relates generally to switches and more particularly to timer switches which are used to protect a load from the voltage irregularities of a direct current input voltage.

Many conventional loads receive power from a direct current input voltage which can be subject to voltage irregularities or excitations, such as power outages. As can be appreciated, the re-application of power to a load after the input voltage has experienced a temporary voltage irregularity can often significantly damage or destroy the load, which is highly undesirable.

Accordingly, timer switches (which are often referred to simply as timers in the art) are well known in the art and are commonly used, among other things, to protect a load from the voltage irregularities of a direct current input voltage. A timer switch can connect the load to the input voltage and suspend the re-application of power to the load after a harmful voltage irregularity in the input voltage has been experienced.

Timer switches are used in many different applications to protect various types of loads (e.g., lights, refrigerators, air conditioners, hot-swap modules, etc.) from harmful input voltage irregularities. As an example, a timer switch can be used to prevent over-stress to a HID lamp ignitor. As another example, a timer switch can be used to prevent over-stress to a system compressor while the system is still pressurized. As another example, a timer switch can be used to prevent re-application of power to hot-swap modules after a short interruption of power.

An electrical timer switch (also commonly referred to as an electro-mechanical timer switch) is one well known type of timer switch which is well known and widely used in the art. Electrical timer switches typically comprise a mechanical device, such as a thermally reactive, bi-metallic switching contact, to provide the primary switching action for the timer.

The utilization of a mechanical device to provide the primary switching action renders electrical timer switches subject to a number of significant drawbacks.

As a first drawback, it has been found that the utilization of a mechanical device to provide the primary switching action renders electrical timer switches relatively unreliable, which is highly undesirable.

As a second drawback, it has been found that the utilization of a mechanical device to provide the primary switching action renders electrical timer switches relatively large in size, which is highly undesirable.

As a third drawback, it has been found that the utilization of a mechanical device to provide the primary switching action renders electrical timer switches excessively sensitive to shock, which is highly undesirable.

As a fourth drawback, it has been found that the utilization of a mechanical device to provide the primary switching action renders electrical timer switches relatively complex in construction, which is highly undesirable.

As a fifth drawback, it has been found that the utilization of a mechanical device (i.e., an electromagnetic coil or a heating element) to provide the primary switching action causes electrical timer switches to consume (and consequently waste) a relatively large amount of energy, which is highly undesirable.

Accordingly, electronic timer switches are well known and widely used in the art. Electronic timer switches differ from electrical timer switches in that an electronic timer switch utilizes a semiconductor device to provide the primary switching action for the switch, the semiconductor device being controlled by a timing element. The utilization of the semiconductor device is desirable when the electronic timer switch has a definitive snap, or hysteretic, switching action, thereby eliminating the occurrence of an intermediate switching state which may result in damage to or unstable operation of the timer switch and load. An example of such an electronic timer switch which utilizes a semiconductor device to provide the primary switching action for the switch is manufactured and sold by Philips Semiconductors under the model number NE555.

As can be appreciated, electronic timer switches experience a number of significant advantages over electro-mechanical timer switches.

As a first advantage, electronic timer switches are more reliable than electro-mechanical timer switches.

As a second advantage, electronic timer switches are smaller and less expensive than electro-mechanical timer switches.

As a third advantage, electronic timer switches are less sensitive to shock than electro-mechanical timer switches.

Although well known and widely used in commerce, electronic timer switches of the type described above often suffer from a couple notable drawbacks.

As a first drawback, electronic timer switches typically require a constant application of voltage from a power supply, which is highly undesirable.

As a second drawback, electronic timer switches typically comprise a timing element which includes a plurality of energy storage elements, such as capacitors. As can be appreciated, the utilization of a plurality of energy storage elements significantly increases the size and cost of the switch, which is highly undesirable. In addition, the utilization of a plurality of energy storage elements renders the switch less reliable, which is highly undesirable.

It should be noted that particular voltage irregularities are often experienced by the input voltage which are not considered harmful to the load. As a result, electronic timer switches are often constructed to include one or more features which permit the re-application of power to the load after the occurrence of one of such harmless voltage irregularities.

As an example, an anti-short cycle timer switch often includes a switch-bounce immunity feature. A switch-bounce immunity feature allows for the re-application of power to the load after a voltage irregularity if the voltage irregularity occurs before the input voltage has been continuously applied to the load for a time period which is less than the time constant for the timer switch. As a result, a timer switch which includes a switch-bounce immunity feature does not interrupt power to the load during the short time period after initial application of power to the switch in which timer switches are prone to harmless initial power switch bouncing.

As another example, a timer switch often includes a latching feature. A latching feature allows for the re-application of power to the load if the application of power has been withdrawn from the load by the switch for a time period which is greater than the time constant for the switch (e.g., a lengthy power outage).

As another example, a timer switch often includes an auto-resetting feature. An auto-resetting feature allows for the automatic re-application of power to the load if the timing element of the timer switch experiences a significant cool-down, or discharge, time period which is greater than the time constant of the switch.

SUMMARY OF THE INVENTION

It is an object of the present invention to provide a new timer switch.

It is another object of the present invention to provide a new electronic timer switch.

It is yet another object of the present invention to provide an electronic timer switch which does not require a constant application of voltage from a power supply.

It is still another object of the present invention to provide an electronic timer switch as described above which includes a limited number of energy storage elements.

It is yet still another object of the present invention to provide an electronic timer switch which is immune to switch-bouncing.

It is another object of the present invention to provide an electronic timer switch which is highly reliable and which is relatively insensitive to shock.

It is yet another object of the present invention to provide an electronic timer switch which has a limited number of parts, which is relatively small in size, which is easy to use, and which is inexpensive to manufacture.

Accordingly, there is provided a timer switch for protecting a load from the voltage irregularities of an input voltage, the load having a first terminal and a second terminal, the second terminal of the load being connected to ground, said switch comprising a transistor switch which includes a first terminal, a second terminal and a third terminal, the first terminal of said transistor switch being connected to the input voltage and the third terminal of said transistor switch being connected to the first terminal of the load and an energy storage element which includes a first terminal and a second terminal, the first terminal of said energy storage element being connected to the second terminal of said transistor switch and the second terminal of said energy storage element being connected to ground.

Additional objects, features, aspects and advantages of the present invention will be set forth, in part, in the description which follows and, in part, will be obvious from the description or may be learned by practice of the invention. In the description, reference is made to the accompanying drawings which form a part thereof and in which is shown by way of illustration specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is, therefore, not to be taken in a limiting sense, and the scope of the present invention is best defined by the appended claims.

BRIEF DESCRIPTION OF THE DRAWINGS

The accompanying drawings, which are hereby incorporated into and constitute a part of this specification, illustrate various embodiments of the present invention and, together with the description, serve to explain the principles of the invention. In the drawings, wherein like reference numerals represent like parts.

DETAILED DESCRIPTION OF PREFERRED EMBODIMENTS

Figure 1:
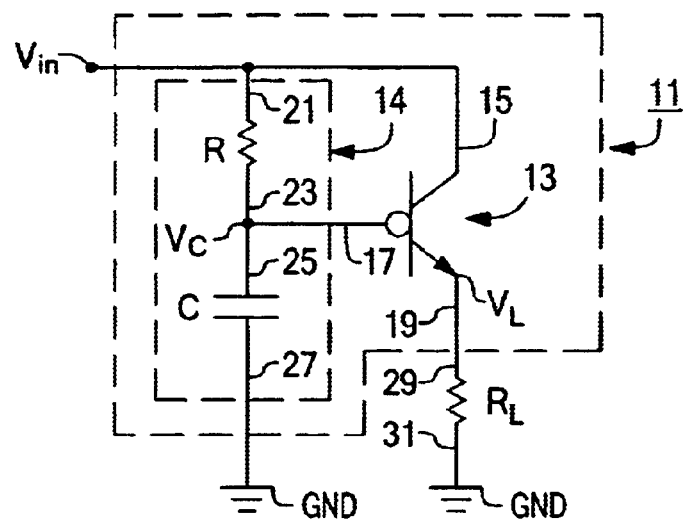
FIG. 1 is a schematic representation of one embodiment of a switch constructed according to the teachings of the present invention.

Referring now to FIG. 1, there is shown a latching-type, anti-short cycle electronic timer switch constructed according to the teachings of the present invention, the timer switch being represented generally by reference numeral 11.

Timer switch, or timer, 11 is a hysteretic timer switch which comprises a transistor switch 13 and a timing element 14 for controlling the switching state of transistor switch 13. As will be described further in detail below, timer switch 11 serves to protect a load resistor $R_L$ from potentially harmful voltage irregularities experienced by an input supply voltage $V_{in}$.

Transistor switch 13 is preferably a three terminal non-inverting transistor switch of the type which is disclosed in U.S. Pat. No. 5,134,323 to J. Congdon, which is incorporated herein by reference, and which is manufactured and sold by BitParts, Inc. of Sudbury, Mass. under its line of Q-BAR® switches as model number QB104M3. Transistor switch 13 comprises a first terminal 15, a second terminal 17 and a third terminal 19.

It should be noted that transistor switch 13 is a signal powered switch which comprises exactly three terminals.

Because it is signal powered and comprises exactly three terminals, transistor switch 13 does not require the constant application of power from a power supply, which is highly desirable. By definition, a signal powered transistor switch is a transistor switch which is supplied power through a signal other than a power supply. As an example, transistor switch 13 may be a three terminal transistor switch which is supplied power through an output signal (e.g., switch model number QB104M3 which is manufactured and sold by BitParts, Inc.). As another example, transistor switch 13 may be a three terminal switch which is supplied power through an input signal (e.g., switch model number QB312-A which is manufactured and sold by BitParts, Inc.).

Timing element 14 provides the time constant that governs the operation of transistor switch 13, as will be described further in detail below. Timing element 14 comprises a resistor R and an energy storage element which, in the present embodiment, is represented as capacitor C.

Resistor R preferably has a value of approximately 10 Kohms and includes a first terminal 21 which is connected to first terminal 15 of transistor switch 13 and a second terminal 23 which is connected to second terminal 17 of transistor switch 13. Input supply voltage $V_{in}$ is applied to switch 11 at first terminal 21 of resistor R.

It should be noted that input supply voltage $V_{in}$ is preferably a direct current (DC) voltage supply. However, input supply voltage $V_{in}$ is subject to various voltage irregularities (e.g., power switch bouncing or power outages) which, in turn, cause the input supply voltage $V_{in}$ to sharply rise and fall within the range of 0 volts and 12 volts. As a result, the principal function of electronic timer switch 11 is to protect load resistor $R_L$ and switch 11 against such voltages irregularities.

Capacitor C preferably has a value of approximately 100 uF and includes a first terminal 25 connected to second terminal 17 of transistor switch 13 and a second terminal 27 connected to ground GND. The capacitor voltage $V_c$ is the voltage at first terminal 25 and its value is derived from the charging and discharging of capacitor C from input voltage $V_{in}$. As will be described further in detail below, capacitor voltage $V_c$ largely determines the operation of timer switch 11.

Together, resistor R and capacitor C of timing element 14 establish the time constant which controls the operation of transistor switch 13. Specifically, the time constant is approximately the value of resistor R multiplied by the value of capacitor C (time constant≅RC). Accordingly, the time constant for timer switch 11 is approximately (10 K ohms) (100 uF)≈1 second. As can be appreciated, 1 second is the approximate time constant that governs operation of timer switch 11. In addition, changing the value of resistor R and/or capacitor C will change the value of the time constant.

Load resistor $R_L$ represents any load (e.g., 10 Kohms) or input terminal which may be connected to timer switch 11 and includes a first terminal 29 connected to third terminal 19 of transistor switch 13 and a second terminal 31 connected to ground GND. A load voltage $V_L$ is the voltage across load resistor $R_L$ and can be measured at first terminal 29.

Figure 2:
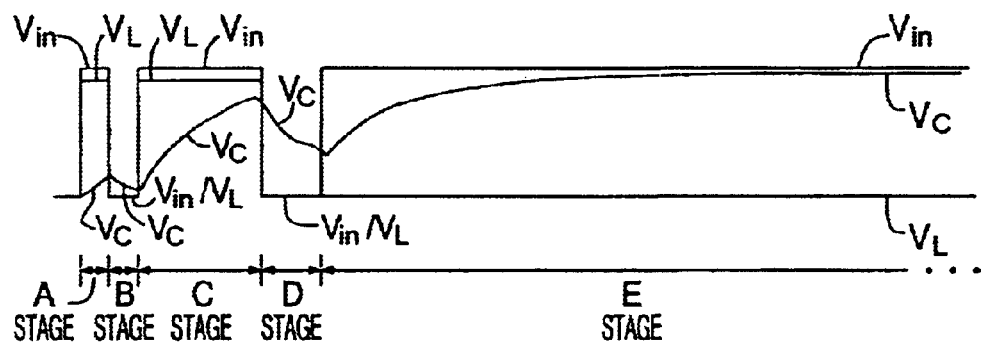
FIG. 2 is a first chart which is useful in understanding the operation of the timer switch shown in FIG. 1.

Referring now to FIG. 2, timer switch 11 functions in the following manner. Specifically, as noted briefly above, input supply voltage $V_{in}$ is a direct current voltage. However, input supply voltage $V_{in}$ is subject to various voltage irregularities (e.g., power switch bouncing or power outages) which, in turn, cause the input supply voltage $V_{in}$ to sharply rise and fall within the range of 0 volts and 12 volts. Accordingly, the waveform for input supply voltage $V_{in}$ is shown in FIG. 2 to represent possible voltage excitations.

At stage A, input supply voltage $V_{in}$ is turned on to a constant high value (e.g., 12 volts). Accordingly, the load voltage $V_L$ similarly rises to a constant high value which is slightly less than input supply voltage $V_{in}$. The capacitor voltage $V_C$ increases as capacitor C becomes charged.

At stage B, input supply voltage $V_{in}$ experiences a switch bounce, thereby causing input supply voltage $V_{in}$ to drop to a constant low value (e.g., 0 volts). Accordingly, the load voltage $V_L$ similarly drops to the same low constant value as input supply voltage $V_{in}$. Once input supply voltage $V_{in}$ drops, capacitor voltage $V_C$ significantly discharges.

At stage C, input supply voltage $V_{in}$ returns to its constant high value (i.e., 12 volts). Because capacitor C significantly discharged at stage B, the return of input supply voltage $V_{in}$ to its constant high value causes load voltage $V_L$ to similarly rise to the same constant value it experienced at stage A. In addition, the return of input supply voltage $V_{in}$ to its constant high value causes the capacitor C to recharge, thereby providing an increasing capacitor voltage $V_C$.

At stage D, input supply voltage $V_{in}$ experiences a short power outage which causes input supply voltage $V_{in}$ to drop to a constant low value (e.g., 0 volts). Accordingly, the load voltage $V_L$ similarly drops to the same low constant value as input supply voltage $V_{in}$. However, it should be noted that, due to the short nature of the power outage during stage D, capacitor C does not have enough time to significantly discharge, as noted by the slight decrease in value of the capacitor voltage $V_C$.

At stage E, input supply voltage $V_{in}$ resumes its constant high value (i.e, 12 volts). However, because capacitor C did not significantly discharge during stage D, the resumption of the input supply voltage $V_{in}$ at its constant high value does not result in the load resistor $R_L$ being powered, thereby leaving the load voltage $V_L$ at the same low constant value it experienced in stage D. In addition, the return of input supply voltage $V_{in}$ to its constant high value causes the capacitor C to recharge, thereby providing an increasing capacitor voltage $V_C$.

As noted above, timer switch 11 prevents re-application of power to load resistor $R_L$ after input voltage $V_{in}$ is interrupted. However, it should be noted that timer switch 11 functions as an anti-short cycle timer in that switch 11 only prevents re-application of power to load resistor $R_L$ after the input voltage $V_{in}$ has been continuously applied to timer switch 11 for a length of time which approximates the RC time constant (approximately 1 second). As a result, anti-short cycle timer switch 11 is prevented from erroneously interrupting power to load resistor $R_L$ during the short period after initial application of power to switch 11 in which timer switches are prone to harmless voltage bouncing.

It should be noted that timer switch 11 is of the latching-type in that once the input voltage $V_{in}$, and subsequently the load voltage $V_L$, have been interrupted, $V_{in}$ must be removed for a length of time which is longer than the approximate time constant (so as to enable capacitor C to significantly discharge) before the load voltage $V_L$ can be reactivated. The connection of resistor R between capacitor C and input voltage $V_{in}$ provides this latching function for timer switch 11.

Figure 3:
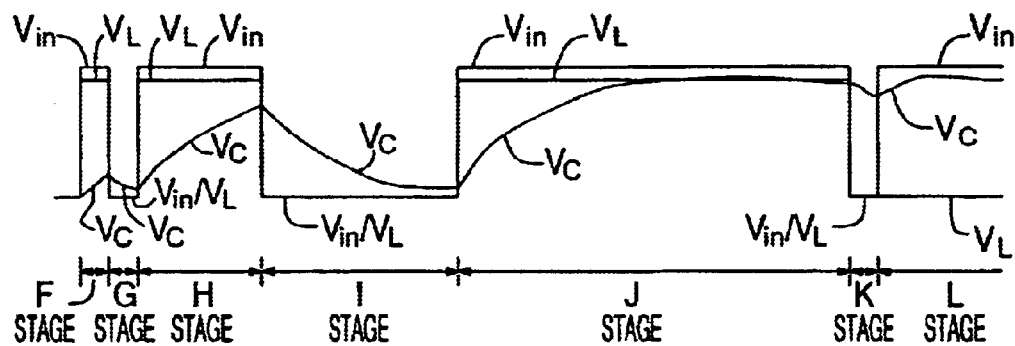
FIG. 3 is a second chart which is useful in understanding the operation of the timer switch shown in FIG. 1.

As another example, referring now to FIG. 3, timer switch 11 functions in the following manner. Specifically, as noted above, input supply voltage $V_{in}$ is subject to various voltage irregularities (e.g., power switch bouncing or power outages) which, in turn, cause the input supply voltage $V_{in}$ to sharply rise and fall within the range of 0 volts and 12 volts. Accordingly, the waveform for input supply voltage $V_{in}$ is shown in FIG. 3 to represent possible voltage excitations.

At stage F, input supply voltage $V_{in}$ is turned on to a constant high value (e.g., 12 volts). Accordingly, the load voltage $V_L$ similarly rises to a constant high value which is slightly less than input supply voltage $V_{in}$. The capacitor voltage $V_C$ increases as capacitor C becomes charged.

At stage G, input supply voltage $V_{in}$ experiences a switch bounce, thereby causing input supply voltage $V_{in}$ to drop to a constant low value (e.g., 0 volts). Accordingly, the load voltage $V_L$ similarly drops to the same low constant value as input supply voltage $V_{in}$. Once input supply voltage $V_{in}$ drops, capacitor voltage $V_C$ significantly discharges.

At stage H, input supply voltage $V_{in}$ returns to its constant high value (i.e., 12 volts). Because capacitor C significantly discharged at stage G, the return of input supply voltage $V_{in}$ to its constant high value causes load voltage $V_L$ to similarly rise to the same constant value it experienced at stage F. In addition, the return of input supply voltage $V_{in}$ to its constant high value causes the capacitor C to recharge, thereby providing an increasing capacitor voltage $V_c$.

At stage I, input supply voltage $V_{in}$ experiences a lengthy power outage, thereby causing input supply voltage $V_{in}$ to drop to a constant low value (e.g., 0 volts). Accordingly, the load voltage $V_L$ similarly drops to the same low constant value as input supply voltage $V_{in}$. Furthermore, it should be noted that, due to the long duration of the power outage at stage I, capacitor C significantly discharges, as noted by the significant decrease in value of the capacitor voltage $V_C$.

At stage J, input supply voltage $V_{in}$ resumes its constant high value (i.e., 12 volts). Because capacitor C significantly discharged during stage I, the return of input supply voltage $V_{in}$ to its constant high value causes load voltage $V_L$ to similarly rise to the same constant value it experienced at stage H. In addition, the return of input supply voltage $V_{in}$ to its constant high value causes the capacitor C to recharge, thereby providing an increasing capacitor voltage $V_C$.

At stage K, input supply voltage $V_{in}$ experiences a short power outage, thereby causing input supply voltage $V_{in}$ to drop to a constant low value (e.g., 0 volts). Accordingly, the load voltage $V_L$ similarly drops to the same low constant value as input supply voltage $V_{in}$. However, it should be noted that, due to the short nature of the power outage during stage K, capacitor C does not have enough time to significantly discharge, as noted by the slight decrease in value of the capacitor voltage $V_C$.

At stage L, input supply voltage $V_{in}$ resumes its constant high value (i.e, 12 volts). However, because capacitor C did not significantly discharge during stage K, the resumption of the input supply voltage $V_{in}$ at its constant high value does not result in the load resistor $R_L$ being powered, thereby leaving the load voltage $V_L$ at the same low constant value as it experienced in stage K. In addition, the return of input supply voltage $V_{in}$ to its constant high value causes the capacitor C to recharge, thereby causing capacitor voltage $V_C$ to increase.

It should be noted that electronic timer switch 11 has numerous advantages over prior art electronic timer switches.

As an example, switch 11 is powered entirely by input supply voltage $V_{in}$ whereas prior art electronic timer switches typically receive a constant supply of power from a power supply. As a result, switch 11 has a lower power requirement than prior art electronic timer switches, which is highly desirable.

As another example, switch 11 comprises a single energy storage element which, in the present embodiment, is represented by capacitor C whereas prior art electronic timer switches typically comprise a plurality of energy storage elements. As a result, switch 11 is smaller, less expensive and more reliable than prior art electronic timer switches.

Figure 4:
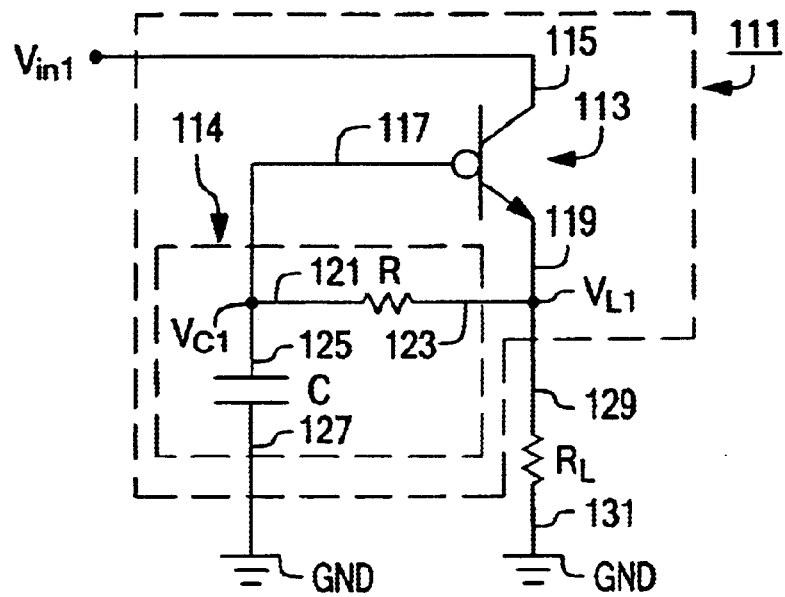
FIG. 4 is schematic representation of another embodiment of a timer switch constructed according to the teachings of the present invention.

Referring now to FIG. 4, there is shown an auto-resetting-type, anti-short cycle timer switch constructed according to the teachings of the present invention, the switch being represented generally by reference numeral 111. As can be appreciated, the principal functional difference between switch 11 and switch 111 is that switch 11 is a latching-type switch whereas switch 111 is an auto-resetting-type switch, as will be described further in detail below.

Timer switch, or timer, 111 comprises a transistor switch 113 and a timing element 114 for controlling the switching state of transistor switch 113. As will be described further in detail below, timer switch 111 serves to protect a load resistor $R_L$ from potentially harmful voltage irregularities experienced by an input supply voltage $V_{in1}$.

Transistor switch 113 is preferably a three terminal non-inverting transistor switch of the type which is disclosed in U.S. Pat. No. 5,134,323 to J. Congdon, which is incorporated herein by reference, and which is manufactured and sold by BitParts, Inc. of Sudbury, Mass. under the model number QB104M3. Transistor switch 113 comprises a first terminal 115, a second terminal 117 and a third terminal 119.

It should be noted that transistor switch 113 is a signal powered switch which comprises exactly three terminals. Because it is signal powered and comprises exactly three terminals, transistor switch 113 does not require the constant application of power from a power supply, which is highly desirable. By definition, a signal powered transistor switch is a transistor switch which is supplied power through a signal other than a power supply. As an example, transistor switch 113 may be a three terminal transistor switch which is supplied power through an output signal (e.g., switch model number QB104M3 which is manufactured and sold by BitParts, Inc.). As another example, transistor switch 113 may be a three terminal switch which is supplied power through an input signal (e.g., switch model number QB312-A which is manufactured and sold by BitParts, Inc.).

An input supply voltage $V_{in1}$ is applied to switch 111 at first terminal 115 of transistor switch 113. Input supply voltage $V_{in1}$ is preferably a direct current (DC) voltage supply. However, input supply voltage $V_{in1}$ is subject to various voltage irregularities (e.g., power switch bouncing or power outages) which, in turn, cause the input supply voltage $V_{in1}$ to sharply rise and fall within the range of 0 volts and 12 volts. As a result, the principal function of electronic timer switch 111 is to protect load resistor $R_L$ and switch 111 against such voltages irregularities.

Timing element 114 provides the time constant that governs the operation of transistor switch 113, as will be described further in detail below. Timing element 114 comprises a resistor R and an energy storage element which, in the present embodiment, is represented as capacitor C.

Resistor R preferably has a value of approximately 10 Kohms and includes a first terminal 121 which is connected to second terminal 117 of transistor switch 113 and a second terminal 123 which is connected to third terminal 119 of transistor switch 113.

Capacitor C preferably has a value of approximately 100 uF and includes a first terminal 125 connected to second terminal 117 of transistor switch 113 and a second terminal 127 connected to ground GND. The capacitor voltage $V_{c1}$ is the voltage at first terminal 125 and its value is derived from the charging and discharging of capacitor C from input voltage $V_{in1}$. As will be described further in detail below, capacitor voltage $V_{c1}$ largely determines the operation of timer switch 111.

Together, resistor R and capacitor C of timing element 114 establish the time constant which controls the operation of transistor switch 113. Specifically, the time constant is approximately the value of resistor R multiplied by the value of capacitor C (time constant≈RC). Accordingly, the time constant for timer switch 111 is approximately (10 K ohms) (100 uF)≈1 second. As can be appreciated, 1 second is the approximate time constant that governs operation of timer switch 111. In addition, changing the value of resistor R and/or capacitor C will change the value of the time constant.

Load resistor $R_L$ represents any load (e.g., 10 Kohms) or input terminal which may be connected to timer switch 111 and includes a first terminal 129 connected to third terminal 119 of transistor switch 113 and a second terminal 131 connected to ground GND. A load voltage $V_{L1}$ is the voltage across load resistor $R_L$ and can be measured at first terminal 129.

Figure 5:
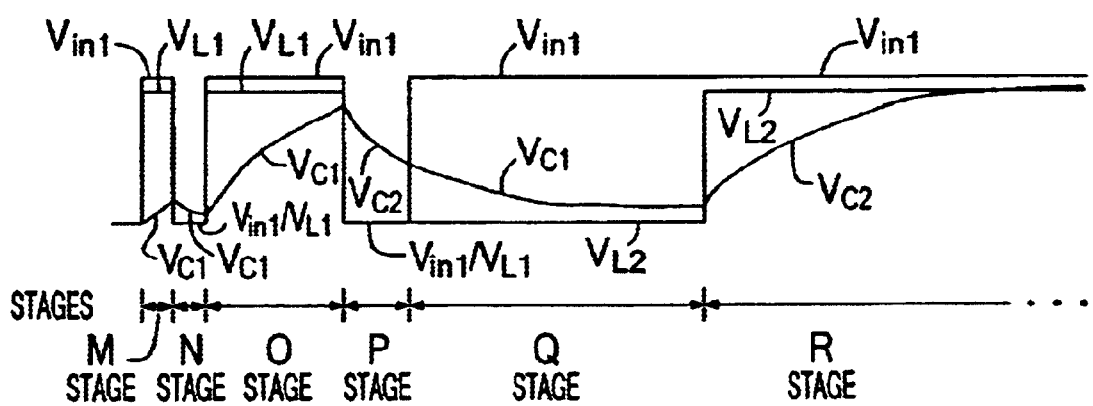
FIG. 5 is a chart useful in understanding the operation of the timer switch shown in FIG. 4.

Referring now to FIG. 5, timer switch 111 functions in the following manner. Specifically, as noted briefly above, input supply voltage $V_{in1}$ is a direct current voltage. However, input supply voltage $V_{in1}$ is subject to various voltage irregularities (e.g., power switch bouncing or power outages) which, in turn, cause the input supply voltage $V_{in1}$ to sharply rise and fall within the range of 0 volts and 12 volts. Accordingly, the waveform for input supply voltage $V_{in1}$ is shown in FIG. 5 to represent possible voltage excitations.

At stage M, input supply voltage $V_{in1}$ is turned on to a constant high value (e.g., 12 volts). Accordingly, the load voltage $V_{L1}$ similarly rises to a constant high value which is slightly less than input supply voltage $V_{in1}$. The capacitor voltage $V_{C1}$ increases as capacitor C becomes charged.

At stage N, input supply voltage $V_{in1}$ experiences a switch bounce, thereby causing input supply voltage $V_{in1}$ to drop to a constant low value (e.g., 0 volts). Accordingly, the load voltage $V_{L1}$ similarly drops to the same low constant value as input supply voltage $V_{in1}$. Once input supply voltage $V_{in1}$ drops, capacitor voltage $V_{C1}$ significantly discharges.

At stage O, input supply voltage $V_{in1}$ returns to its constant high value (i.e., 12 volts). Because capacitor C significantly discharged at stage N, the return of input supply voltage $V_{in1}$ to its constant high value causes load voltage $V_{L1}$ to similarly rise to the same constant value it experienced at stage M. In addition, the return of input supply voltage $V_{in1}$ to its constant high value causes the capacitor C to recharge, thereby providing an increasing capacitor voltage $V_{C1}$.

At stage P, input supply voltage $V_{in1}$ experiences a short power outage which causes input supply voltage $V_{in1}$ to drop to a constant low value (e.g., 0 volts). Accordingly, the load voltage $V_{L1}$ similarly drops to the same low constant value as input supply voltage $V_{in1}$. However, it should be noted that, due to the short nature of the power outage during stage P, capacitor C does not have enough time to significantly discharge, as noted by the slight decrease in value of the capacitor voltage $V_{C1}$.

At stage Q, input supply voltage $V_{in1}$ resumes its constant high value (i.e., 12 volts). However, because capacitor C did not significantly discharge during stage P, the resumption of the input supply voltage $V_{in1}$ at its constant high value does not result in the load resistor $R_L$ being powered, thereby leaving the load voltage $V_{R1}$ at the same low constant value as it experienced in stage P. In addition, it should be noted that, in stage Q, capacitor C continues to discharge, as noted by the slight decrease in value of the capacitor voltage $V_{C1}$.

At stage R, input supply voltage $V_{in1}$ retains its constant high value (i.e., 12 volts). However, at the beginning of stage R, capacitor C is significantly discharged. As a result of the significant discharge of capacitor C, the load resistor $R_L$ becomes re-powered, thereby returning the load voltage $V_{L1}$ to the same high constant value it experienced in stage O.

As noted above, timer switch 111 prevents re-application of power to load resistor $R_L$ after input voltage $V_{in1}$ is interrupted. However, it should be noted that timer switch 111 functions as an anti-short cycle timer in that switch 111 only prevents re-application of power to load resistor $R_L$ after the input voltage $V_{in1}$ has been continuously applied to timer switch 111 for a length of time which approximates the RC time constant (approximately 1 second). As a result, anti-short cycle timer switch 111 is prevented from erroneously interrupting power to load resistor $R_L$ during the short period after initial application of power to switch 111 in which time switches are prone to harmless voltage bouncing.

It should be noted that timer switch 111 is of the auto-resetting-type in that once the input voltage $V_{in1}$, and subsequently the load voltage $V_{L1}$, have been interrupted, the load voltage $V_{L1}$ will only be reactivated after a significant cool-down, or discharge, delay. Connecting resistor R between capacitor C and load voltage $V_{L1}$ (rather than input voltage $V_{in1}$ as in timer 11) provides the auto-resetting feature of timer 111.

The auto-resetting feature of switch 111 renders it especially useful for line operated devices, such as street lights, refrigerators, and air conditioners. The auto-resetting feature of switch 111 also renders it especially useful for hot-swap modules and computer peripherals.

Figure 6:
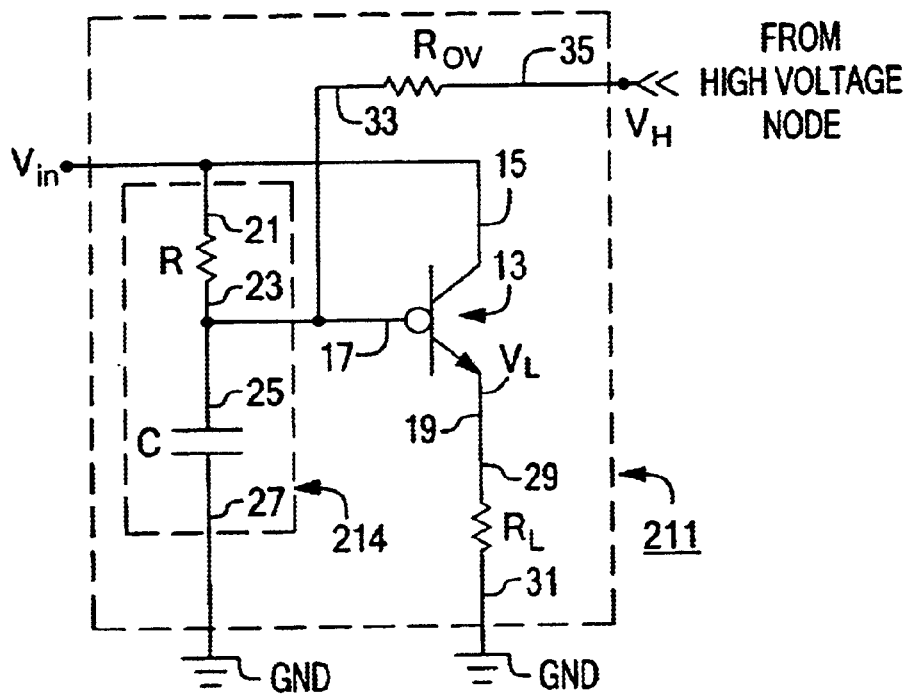
FIG. 6 is schematic representation of another embodiment of a timer switch constructed according to the teachings of the present invention.

Referring now to FIG. 6, there is shown a latching-type, anti-short cycle timer switch constructed according to the teachings of the present invention, the switch being represented generally by reference numeral 211. As can be appreciated, the principal functional difference between switch 211 and switch 11 is that switch 211 includes an over-voltage shutdown feature which will be described further in detail below.

Specifically, switch 211 is identical to switch 11 in that switch 211 comprises a transistor switch 13 and a timing element 214 for controlling the switching state of transistor switch 13. As will be described further in detail below, timer switch 211 serves to protect a load resistor $R_L$ from potentially harmful voltage irregularities experienced by an input supply voltage $V_{in}$.

Transistor switch 13 is preferably a three terminal non-inverting transistor switch of the type which is disclosed in U.S. Pat. No. 5,134,323 to J. Congdon, which is incorporated herein by reference, and which is manufactured and sold by BitParts, Inc. of Sudbury, Mass. under the model number QB104M3. Transistor switch 13 comprises a first terminal 15, a second terminal 17 and a third terminal 19.

It should be noted that transistor switch 13 is a signal powered switch which comprises exactly three terminals. Because it is signal powered and comprises exactly three terminals, transistor switch 13 does not require the constant application of power from a power supply, which is highly desirable. By definition, a signal powered transistor switch is a transistor switch which is supplied power through a signal other than a power supply. As an example, transistor switch 13 may be a three terminal transistor switch which is supplied power through an output signal (e.g., switch model number QB104M3 which is manufactured and sold by Bitparts, Inc.). As another example, transistor switch 13 may be a three terminal switch which is supplied power through an input signal (e.g., switch model number QB312-A which is manufactured and sold by BitPats, Inc.).

Timing element 214 provides the time constant that governs the operation of transistor switch 13, as will be described further in detail below. Timing element 214 comprises a resistor R and an energy storage element which, in the present embodiment, is represented as capacitor C.

Resistor R preferably has a value of approximately 10 Kohms and includes a first terminal 21 which is connected to first terminal 15 of transistor switch 13 and a second terminal 23 which is connected to second terminal 17 of transistor switch 13. Input supply voltage $V_{in}$ is applied to switch 211 at first terminal 21 of resistor R.

Capacitor C preferably has a value of approximately 100 uF and includes a first terminal 25 connected to second terminal 17 of transistor switch 13 and a second terminal 27 connected to ground GND. The capacitor voltage $V_C$ is the voltage at first terminal 25 and its value is derived from the charging and discharging of capacitor C from input voltage $V_{in}$. As will be described further in detail below, capacitor voltage $V_C$ largely determines the operation of timer switch 211.

Together, resistor R and capacitor C of timing element 214 establish the time constant which controls the operation of transistor switch 13. Specifically, the time constant is approximately the value of resistor R multiplied by the value of capacitor C (time constant≅RC). Accordingly, the time constant for timer switch 211 is approximately (10 K ohms) (100 uF)≅1 second. As can be appreciated, 1 second is the approximate time constant that governs operation of timer switch 211. In addition, changing the value of resistor R and/or capacitor C will change the value of the time constant.

Load resistor $R_L$ represents any load (e.g., 10 Kohms) or input terminal which may be connected to timer switch 211 and includes a first terminal 29 connected to third terminal 19 of transistor switch 13 and a second terminal 31 connected to ground GND. A load voltage $V_L$ is the voltage across load resistor $R_L$ and can be measured at first terminal 29.

Switch 211 differs from switch 11 in that switch 211 additionally comprises an over-voltage sensing resistor $R_{OV}$. Over-voltage sensing resistor $R_{OV}$ is preferably 1 Mohm and includes a first terminal 33 connected to second terminal 17 of transistor switch 13 and a second terminal 35 connected to a high voltage node $V_H$. As will be described further in detail below, if the voltage at high voltage node $V_H$ (and accordingly the resulting current charging capacitor C) raises the voltage at second terminal 17 of transistor switch 13 sufficiently above input voltage $V_{in}$, timer switch 211 will deactivate load resistor $R_L$ for protection purposes.

Figure 7:
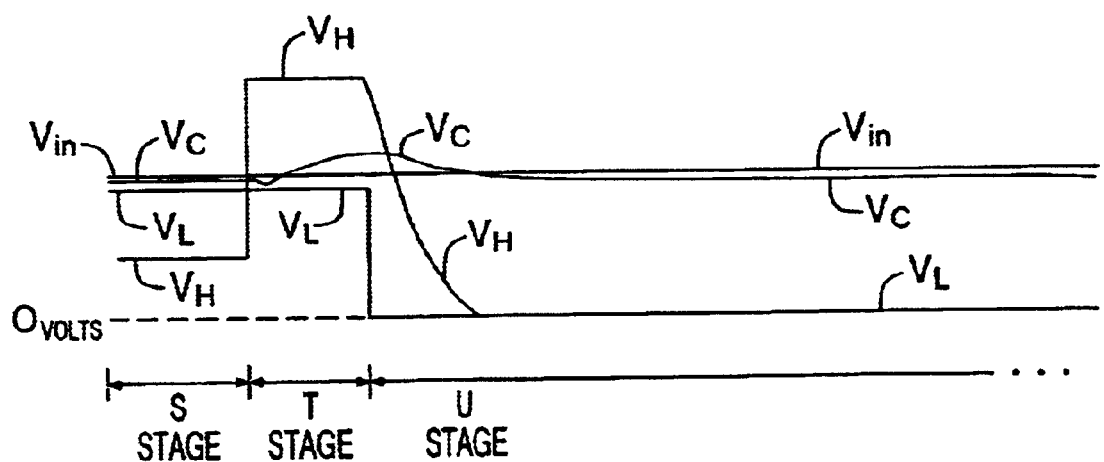
FIG. 7 is a chart useful in understanding the operation of the timer switch shown in FIG. 6.

Specifically, referring now to FIG. 7, electronic timer switch 211 functions in the following manner. At stage S, input supply voltage $V_{in}$ is shown as having a constant high value (e.g., 12 volts). Accordingly, the load voltage $V_L$ and the capacitor voltage $V_C$ similarly have constant high values which are slightly less than input supply voltage $V_{in}$. It should be noted that high voltage node $V_H$ is represented in stage S as having a constant low value.

At stage T, with input supply voltage $V_{in}$ remaining at a constant high value, the high voltage node $V_H$ experiences an over-voltage condition, thereby providing high voltage node $V_H$ with a voltage which is significantly higher than the voltage at input voltage $V_{in}$. The over-voltage condition at high voltage node $V_H$ begins to charge capacitor voltage $V_C$ without affecting the condition of load voltage $V_L$, the load voltage $V_L$ remaining constant from stage S to stage T.

At stage U, once capacitor voltage $V_C$ rises sufficiently above input voltage $V_{in}$, timer switch 211 removes power from load resistor $R_L$ and drops load voltage $V_L$ to zero volts. As can be appreciated, load voltage $V_L$ remains powered down and latched at zero volts even upon the removal of the high voltage from high voltage node $V_H$. In fact, load resistor $R_L$ can only receive a re-application of power if input voltage $V_{in}$ is removed for a significant cool-down period (approximately the length of the time constant for timing element 214).

It should be noted that removing capacitor C from timer switch 211 would create a very useful over-voltage detector with latching action.

Figure 8:
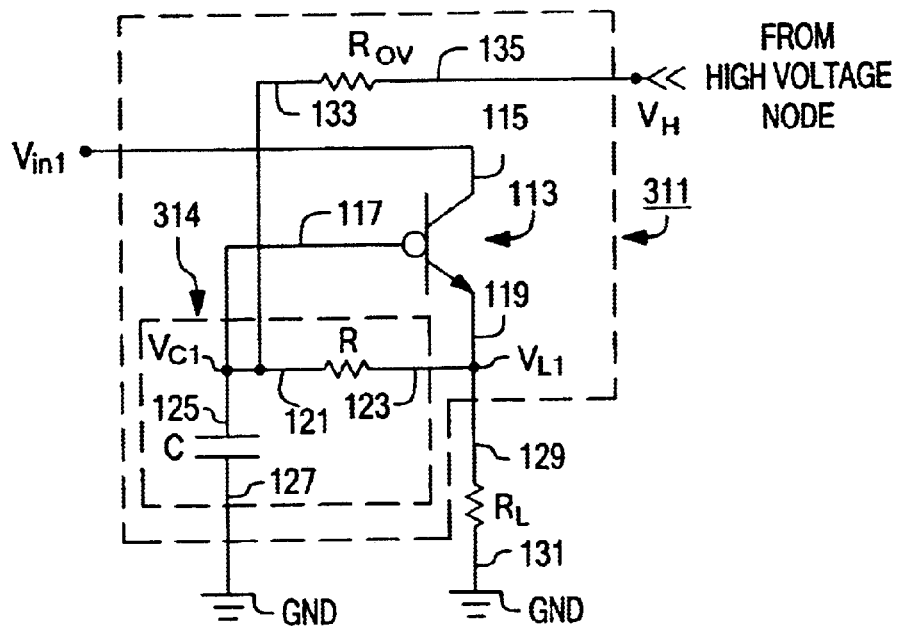
FIG. 8 is schematic representation of another embodiment of a timer switch constructed according to the teachings of the present invention.

Referring now to FIG. 8, there is shown an auto-resetting-type, anti-short cycle timer switch constructed according to the teachings of the present invention, the timer switch being represented generally by reference numeral 311. As can be appreciated, the principal functional difference between switch 311 and switch 111 is that switch 311 includes an over-voltage shutdown feature which will be described further in detail below.

Specifically, switch 311 is identical to switch 111 in that switch 311 comprises a transistor switch 113 and a timing element 314 for controlling the switching state of transistor switch 13. As will be described further in detail below, timer switch 311 serves to protect a load resistor $R_L$ from potentially harmful voltage irregularities experienced by an input supply voltage $V_{in}$.

Transistor switch 113 is preferably a three terminal non-inverting transistor switch of the type which is disclosed in U.S. Pat. No. 5,134,323 to J. Congdon, which is incorporated herein by reference, and which is manufactured and sold by BitPats, Inc. of Sudbury, Mass. under the model number QB104M3. Transistor switch 113 comprises a first terminal 115, a second terminal 117 and a third terminal 119.

It should be noted that transistor switch 113 is a signal powered switch which comprises exactly three terminals. Because it is signal powered and comprises exactly three terminals, transistor switch 113 does not require the constant application of power from a power supply, which is highly desirable. By definition, a signal powered transistor switch is a transistor switch which is supplied power through a signal other than a power supply. As an example, transistor switch 113 may be a three terminal transistor switch which is supplied power through an output signal (e.g., switch model number QB104M3 which is manufactured and sold by BitParts, Inc.). As another example, transistor switch 113 may be a three terminal switch which is supplied power through an input signal (e.g., switch model number QB312-A which is manufactured and sold by BitParts, Inc.).

Timing element 314 provides the time constant that governs the operation of transistor switch 113, as will be described further in detail below. Timing element 314 comprises a resistor R and an energy storage element which, in the present embodiment, is represented as capacitor C.

Resistor R preferably has a value of approximately 10 Kohms and includes a first terminal 121 which is connected to first terminal 115 of transistor switch 113 and a second terminal 123 which is connected to second terminal 117 of transistor switch 113. Input supply voltage $V_{in1}$ is applied to switch 311 at first terminal 121 of resistor R.

Capacitor C preferably has a value of approximately 100 uF and includes a first terminal 125 connected to second terminal 117 of transistor switch 113 and a second terminal 127 connected to ground GND. The capacitor voltage $V_{c1}$ is the voltage at first terminal 125 and its value is derived from the charging and discharging of capacitor C from input voltage $V_{in1}$. As will be described further in detail below, capacitor voltage $V_{c1}$ largely determines the operation of timer switch 311.

Together, resistor R and capacitor C of timing element 314 establish the time constant which controls the operation of transistor switch 113. Specifically, the time constant is approximately the value of resistor R multiplied by the value of capacitor C (time constant≈RC). Accordingly, the time constant for timer switch 311 is approximately (10 K ohms) (100 uF)≅1 second. As can be appreciated, 1 second is the approximate time constant that governs operation of timer switch 311. In addition, changing the value of resistor R and/or capacitor C will change the value of the time constant.

Load resistor $R_L$ represents any load (e.g., 10 Kohms) or input terminal which may be connected to timer switch 311 and includes a first terminal 129 connected to third terminal 119 of transistor switch 113 and a second terminal 131 connected to ground GND. A load voltage $V_{L1}$ is the voltage across load resistor $R_L$ and can be measured at first terminal 129.

Switch 311 differs from switch 111 in that switch 311 additionally comprises an overvoltage sensing resistor $R_{OV}$. Over-voltage sensing resistor $R_{OV}$ is preferably 1 Mohm and includes a first terminal 133 connected to second terminal 117 of transistor switch 113 and a second terminal 135 connected to a high voltage node $V_H$. As will be described further in detail below, if the voltage at high voltage node $V_H$ (and accordingly the resulting current charging capacitor C) raises the voltage at second terminal 117 of transistor switch 113 sufficiently above input voltage $V_{in1}$, timer switch 311 will deactivate load resistor $R_L$ for protection purposes.

Figure 9:
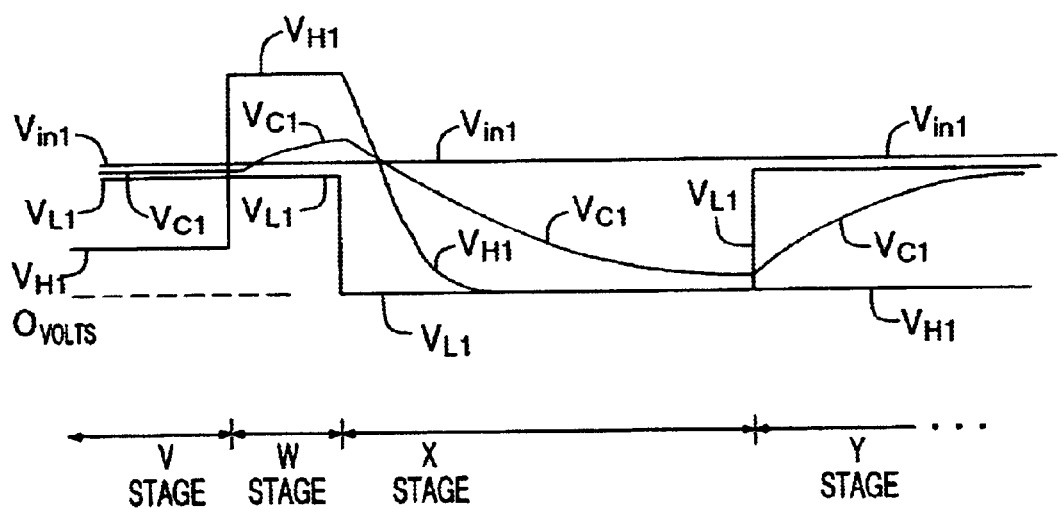
FIG. 9 is a chart useful in understanding the operation of the timer switch shown in FIG. 8.

Specifically, referring now to FIG. 9, auto-resetting timer switch 311 functions in the following manner. At stage V, input supply voltage $V_{in1}$ is shown as having a constant high value (e.g., 12 volts). Accordingly, the load voltage $V_{L1}$ and the capacitor voltage $V_{C1}$ similarly have constant high values which are slightly less than input supply voltage $V_{in1}$. It should be noted that high voltage node $V_{H1}$ is represented in stage S as having a constant low value.

At stage W, with input supply voltage $V_{in1}$ remaining at a constant high value, the high voltage node $V_{H1}$ experiences an over-voltage condition, thereby providing high voltage node $V_{H1}$ with a voltage which is significantly higher than the voltage at input voltage $V_{in1}$. The overvoltage condition at high voltage node $V_H$ begins to charge capacitor C (raising voltage $V_C$) but does not affect the condition of load voltage $V_L$, the load voltage $V_L$ remaining constant through stage W.

At stage X, once capacitor voltage $V_{C1}$ rises sufficiently above input voltage $V_{in1}$, timer switch 311 removes power from load resistor $R_L$, thereby dropping load voltage $V_{L1}$ to zero volts. After the application of power has been removed from load resistor $R_L$, high voltage $V_{H1}$ quickly drops to a constant zero voltage, thereby causing capacitor C to slowly discharge.

At stage Y, as high voltage node $V_{H1}$ remains at a low value for a significant cool-down period (approximately the length of the time constant for timing element 314), capacitor C continues to significantly discharge. Once capacitor voltage $V_{C1}$ significantly discharges and reaches a low level, power is automatically reapplied to load resistor $R_L$, thereby reactivating load voltage $V_{L1}$ to the value it had previously at stage V. Specifically, because resistor R is connected between capacitor voltage $V_{C1}$ and load voltage $V_{L1}$, load resistor $R_L$ will be reactivated only after the high voltage node $V_{H1}$ experiences a significant cool-down period, regardless of whether input voltage $V_{in1}$ drops or remains constant.

It should be noted that load resistor $R_L$ in timer switches 11, 111, 211 and 311 represents a variety of different potential loads.

Figure 10:
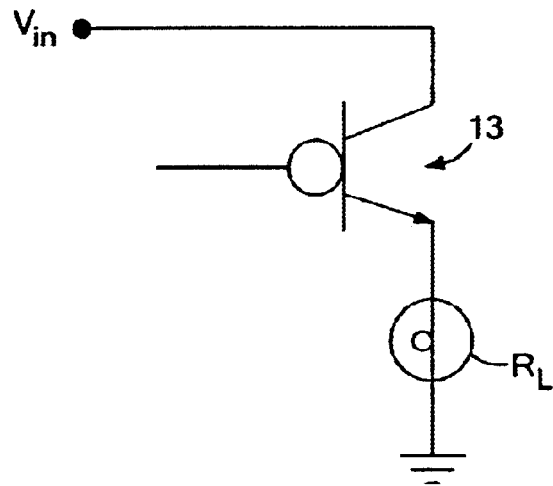
FIG. 10 is a schematic view of one representation the load resistor shown in the timer switches shown in FIGS. 1, 4, 6 and 8.

As an example, as shown in FIG. 10, load resistor $R_L$ may represent an indicator lamp (i.e., a #47 incandescent lamp or other similar lamp). Similarly, load resistor $R_L$ may represent a motor or other similar device.

Figure 11:
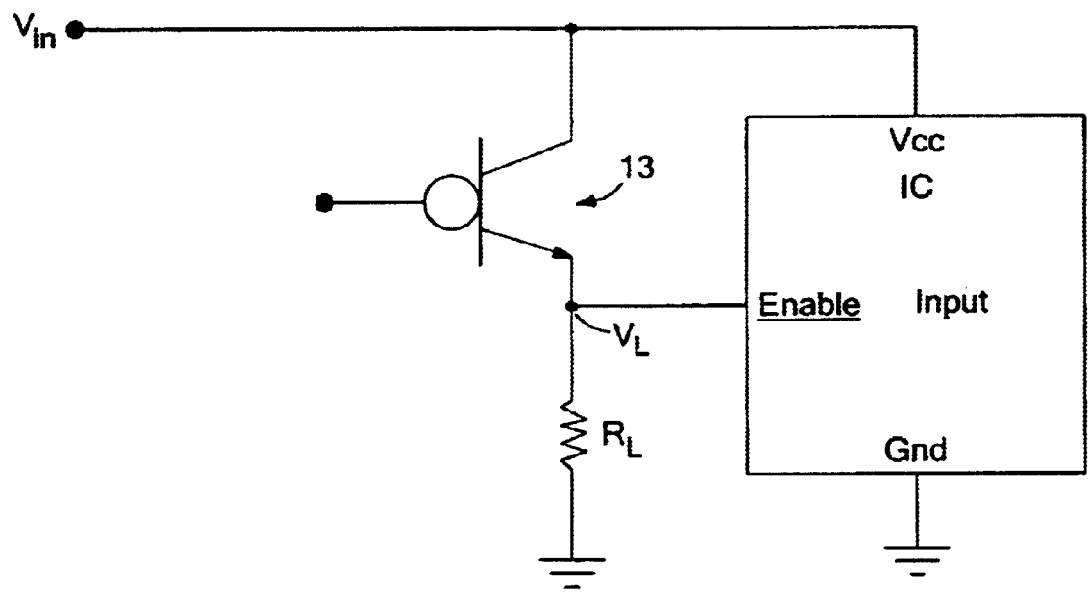
FIG. 11 is a schematic view of another representation of the load resistor shown in the timer switches shown in FIGS. 1, 4, 6 and 8.

As another example, as shown in FIG. 11, load resistor $R_L$ may represent a pull-down resistor. In this manner, the load voltage $V_L$ can be applied to the enable input of an integrated circuit (e.g., chip number MIC1557 IC) which, in turn, can be used to energize a power converter.

As another example, load resistor $R_L$ may represent a heating element or a cooling device, such as a fan, refrigerator, air conditioner or Peltier.

As another example, load resistor $R_L$ may represent a relay coil, converter or any other similar load to which the load voltage $V_L$ of the aforementioned timer switches is desired to be applied.

It should be noted that, in many circumstances, the load resistor $R_L$ will experience a "warming up," "charging up," "pressuring up," or other similar characteristic when energized, thereby rendering the timer switch especially useful. In addition, the timer switches have other desirable electrical characteristics which will become more evident in other potential applications.

It should be noted that many variations of the timer switches disclosed above could be implemented and, accordingly, fall within the scope of the present invention.

Figure 12:
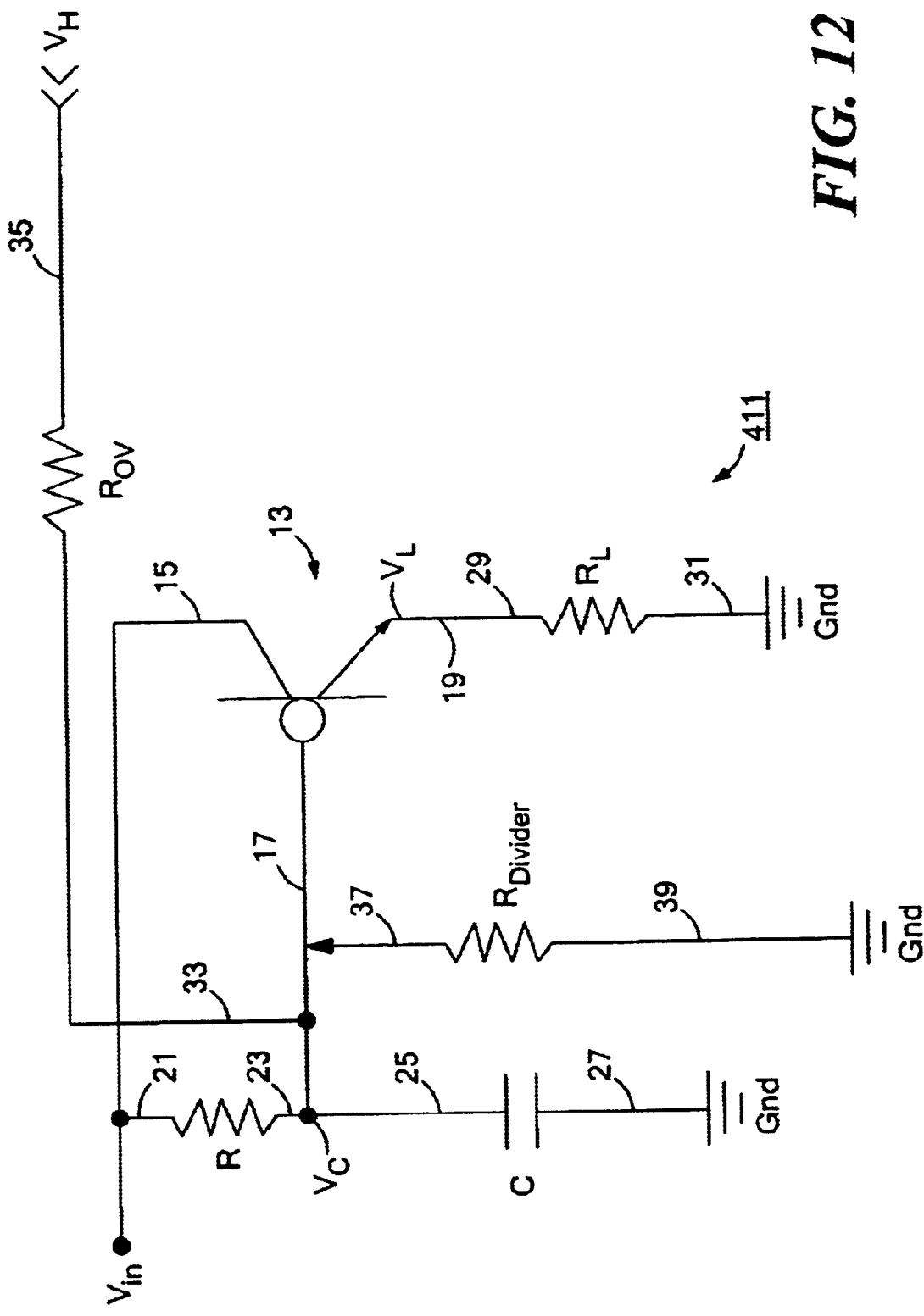
FIG. 12 is schematic representation of another embodiment of a timer switch constructed according to the teachings of the present invention.

For example, referring now to FIG. 12, there is shown a latching, anti-short cycle electronic timer switch with an over-voltage shutdown feature constructed according to the teachings of the present invention, the switch being identified generally by reference numeral 411. Switch 411 differs from switch 211 in that switch 411 additionally comprises a divider resistor $R_{divider}$ which includes a first terminal 37 connected to second terminal of transistor switch 13 and a second terminal 39 connected to ground GND, thereby disposing divider resistor $R_{divider}$ in parallel with capacitor C. In use, divider resistor $R_{divider}$ serves to reduce the sensitivity of timer switch 411 to dips in input voltage $V_{in}$ and over-voltage applications, thereby enabling for the adjustment of shut-down and other trigger points.

As another example, resistors could be added and/or changed in the timer switches to change the action and/or increase sensitivity and timing of the switches.

As another example, capacitors could be added and/or changed in the timer switches to change the action and/or increase sensitivity and timing of the switches. Specifically, capacitor C could be removed from the timer switches (set to zero), thereby enabling the latching timer circuits to be used as simple latches with adjustable sensitivity and short delay.

As another example, diodes can be inserted in series with various resistors to change the charge and/or discharge times for the switches relative to the "RC" time constant and to eliminate sensitivity to reversed voltages (e.g., input voltage $V_{in}$ or high voltage $V_H$).

As another example, a source resistance $R_S$ can be utilized in the timer switches to provide a useful additional timer triggering mode.

Figure 13:
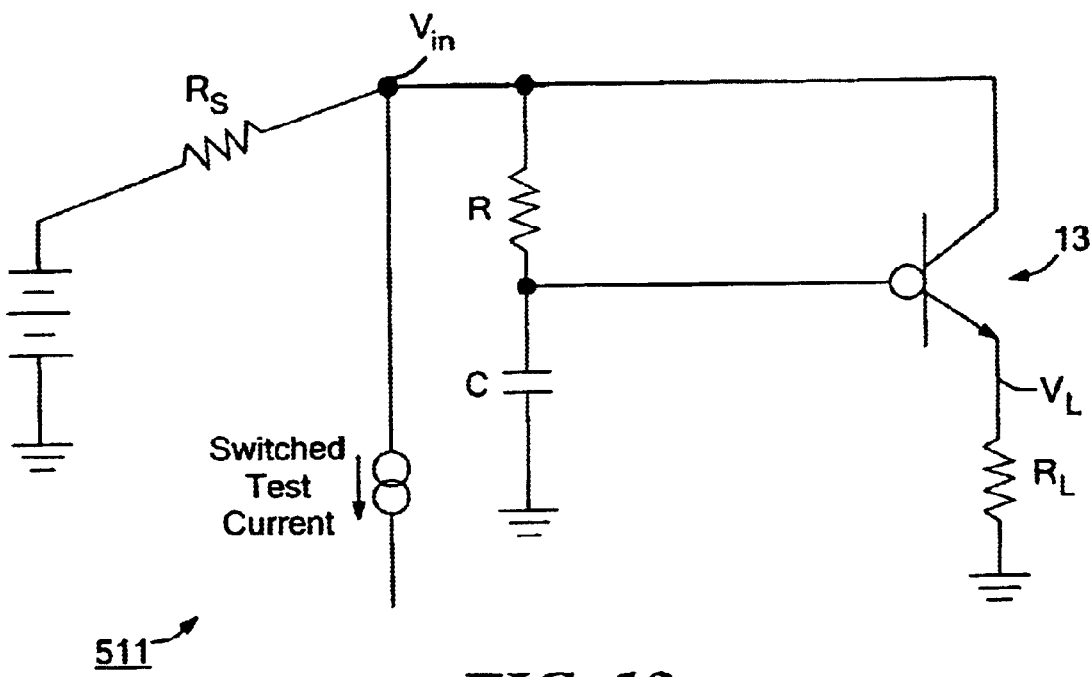
FIG. 13 is schematic representation of another embodiment of a timer switch constructed according to the teachings of the present invention.

Specifically, a source resistance $R_S$ is added to timer switch 11 to create the timer switch 511 shown in FIG. 13. Source resistance $R_S$ is placed in series with the input voltage $V_{in}$ (or it may simply be the internal resistance of input voltage $V_{in}$, such as in a battery) and a device is provided to shunt current to ground. As such, if source resistance $R_S$ is too large, load voltage $V_L$ will be deactivated.

Figure 14:
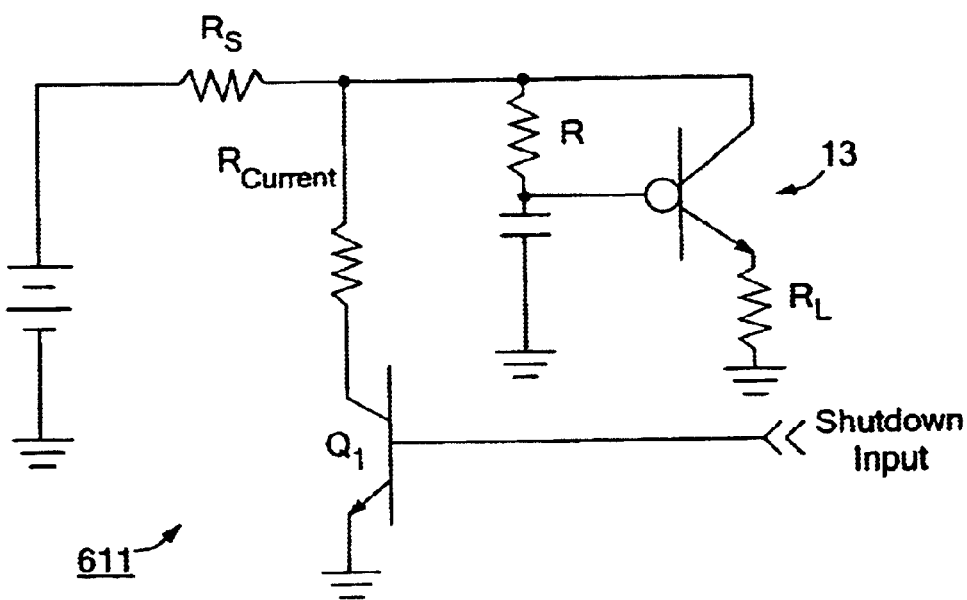
FIG. 14 is schematic representation of another embodiment of a timer switch constructed according to the teachings of the present invention.

In addition, a source resistance $R_S$ is added to timer switch 11 to create the timer switch 611 shown in FIG. 14. Source resistance $R_S$ is a real resistor (e.g., having a value of 100 ohms) and a current resistor $R_{current}$ is switched by an additional switch $Q_1$ to provide another input to deactivate load resistor $R_L$.

The embodiments of the present invention described above are intended to be merely exemplary and those skilled in the art shall be able to make numerous variations and modifications to it without departing from the spirit of the present invention. All such variations and modifications are intended to be within the scope of the present invention as defined in the appended claims.

For example, while the present embodiments can be used to protect a load from the voltage irregularities of a direct current input voltage, it is to be understood that the timer switches described herein could be used to control an alternating current (AC) load by adding one or more additional components (e.g., a relay or triac). Configured as such, the direct current load would serve as a triac gate or relay coil that controls the AC load.

What is claimed is:

1. A timer switch for protecting a load from the voltage irregularities of an input voltage, the load having a first terminal and a second terminal, the second terminal of the load being connected to ground, said switch comprising:
   (a) a transistor switch which includes a first terminal, a second terminal and a third terminal, the first terminal of said transistor switch being connected to the input voltage and the third terminal of said transistor switch being connected to the first terminal of the load; and
   (b) an energy storage element which includes a first terminal and a second terminal, the first terminal of said energy storage element being connected to the second terminal of said transistor switch and the second terminal of said energy storage element being connected to ground.

2. The timer switch as claimed in claim 1 wherein said timer switch comprises exactly one energy storage element.

3. The timer switch as claimed in claim 2 wherein said energy storage element is in the form of a capacitor.

4. The timer switch as claimed in claim 3 wherein said energy storage element is in the form of a capacitor having a value of 100 uF.

5. The timer switch as claimed in claim 2 wherein neither said transistor switch nor said energy storage element requires a power supply.

6. The timer switch as claimed in claim 2 wherein said transistor switch is signal powered.

7. The timer switch as claimed in claim 6 wherein said transistor switch is powered by the input voltage.

8. The timer switch as claimed in claim 6 wherein said transistor switch is powered by the output voltage.

9. The timer switch as claimed in claim 6 wherein said transistor switch comprises exactly three terminals.

10. The timer switch as claimed in claim 9 wherein said transistor switch is non-inverting.

11. The timer switch as claimed in claim 10 wherein said transistor switch is of the type manufactured and sold by BitParts, Inc. of Sudbury, Mass. under the model number QB104M3.

12. The timer switch as claimed in claim 6 further comprising a first resistor which includes a first terminal and a second terminal, the first terminal of said first resistor being connected to the input voltage and the second terminal of said first resistor being connected to the second terminal of said transistor switch.

13. The timer switch as claimed in claim 12 wherein said first resistor has a value of approximately 10 Kohms.

14. The timer switch as claimed in claim 12 further comprising a second resistor which includes a first terminal and a second terminal, the first terminal of said second resistor being connected to the second terminal of said transistor switch and the second terminal of said second resistor being connected to a high voltage node.

15. The timer switch as claimed in claim 14 wherein said second resistor has a value of approximately 1 Mohm.

16. The timer switch as claimed in claim 14 further comprising a third resistor which includes a first terminal and a second terminal, the first terminal of said third resistor being connected to the second terminal of said transistor switch and the second terminal of said third resistor being connected to ground.

17. The timer switch as claimed in claim 6 further comprising a resistor which includes a first terminal and a second terminal, the first terminal of said resistor being connected to the second terminal of said transistor switch and the second terminal of said resistor being connected to the third terminal of said transistor switch.

18. The timer switch as claimed in claim 17 wherein said resistor has a value of approximately 10 Kohms.

19. The timer switch as claimed in claim 18 further comprising a second resistor which includes a first terminal and a second terminal, the first terminal of said second resistor being connected to the second terminal of said transistor switch and the second terminal of said second resistor being connected to a high voltage node.

20. The timer switch as claimed in claim 19 wherein said second resistor has a value of approximately 1 Mohm.

21. A timer switch for protecting a load from the voltage irregularities of an input voltage, the load having a first terminal and a second terminal, the second terminal of the load being connected to ground, said switch comprising:
   (a) a transistor switch; and
   (b) a timing element connected to said transistor switch, said timing element comprising exactly one energy storage element.

22. The timer switch as claimed in claim 21 wherein neither said transistor switch nor said timing element requires a power supply.

23. The timer switch as claimed in claim 22 wherein said transistor switch is signal powered.

24. The timer switch as claimed in claim 23 wherein said transistor switch is powered by the input voltage.

25. The timer switch as claimed in claim 23 wherein said transistor switch is powered by the output voltage.

26. The timer switch as claimed in claim 23 wherein said transistor switch comprises exactly three terminals.

* * * * *